United States Patent
Melanson

(10) Patent No.: US 6,593,806 B1
(45) Date of Patent: Jul. 15, 2003

(54) CIRCUITS AND METHODS FOR COMPENSATING SWITCHED MODE AMPLIFIERS

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/927,808

(22) Filed: Aug. 10, 2001

(51) Int. Cl.$^7$ ............................. H03F 3/38; H03F 3/68
(52) U.S. Cl. ....................... 330/10; 330/149; 330/151
(58) Field of Search ........................ 330/10, 2, 207 A, 330/250, 149

(56) References Cited

U.S. PATENT DOCUMENTS

| | | | | |
|---|---|---|---|---|
| 4,178,557 A | * | 12/1979 | Henry | 330/10 |
| 4,831,334 A | * | 5/1989 | Hudspeth et al. | 330/10 |
| 5,132,637 A | * | 7/1992 | Swanson | 330/10 |
| 5,410,280 A | * | 4/1995 | Linguet et al. | 330/10 |
| 5,617,058 A | | 4/1997 | Adrian et al. | |
| 5,699,383 A | * | 12/1997 | Ichiyoshi | 330/149 |
| 5,886,573 A | | 3/1999 | Kolanek | |
| 5,959,499 A | * | 9/1999 | Khan et al. | 330/149 |
| 6,054,896 A | * | 4/2000 | Wright et al. | 330/149 |
| 6,078,216 A | * | 6/2000 | Proctor, Jr. | 330/151 |
| 6,147,553 A | | 11/2000 | Kolanek | |
| 6,342,810 B1 | * | 1/2002 | Wright et al. | 330/51 |
| 6,373,334 B1 | | 4/2002 | Melanson | |
| 6,407,635 B2 | * | 6/2002 | Mucenieks et al. | 330/149 |

* cited by examiner

*Primary Examiner*—Michael Tokar
*Assistant Examiner*—Lam T. Mai
(74) *Attorney, Agent, or Firm*—James J. Murphy, Esq.; Winstead Sechrest & Minick

(57) ABSTRACT

A system and method for compensating switched mode amplifiers. The amplifier system includes an adaptive filter coupled to the output of circuitry that recovers the analog signal from the output of the switching amplifier circuitry. The adaptive filter derives an inverse transfer function of the forward path through the system. The derived inverse transfer function is used to generate a coefficient map which a compensation filter responsively compensates for from variations in the output load of the amplifier system. In the disclosed method, the deriving the inverse transfer function may further include calibrating the adaptive filter continuously, at system startup or in response to user demand.

26 Claims, 4 Drawing Sheets

CIRCUITS AND METHODS FOR COMPENSATING SWITCHED MODE AMPLIFIERS

BACKGROUND OF THE INVENTION

1. Field of Invention

The present invention relates in general to switched mode electronic amplifiers, and in particular to circuits and methods for compensating for switched mode amplifiers.

2. Background of Invention

Class D audio power amplifiers (APAs) have been used for many years in systems, such as wireline telephony, where high bandwidth is not critical. More recently however, new fabrication techniques, and in particular, new techniques for fabricating power transistors, have made integrated Class D APAs possible. This has extended their potential applications to lower-power, higher-bandwidth systems, including battery-powered portable music players and wireless communications devices.

One major advantage of Class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above ninety percent (90%). In contrast, the typical Class AB push-pull amplifier, using output transistors whose conduction varies linearly during each half-cycle, has an efficiency of around sixty percent (60%). The increased efficiency of Class D amplifiers in turn reduces power consumption and consequently lowers heat dissipation and improves battery life in portable systems.

One problem that must be addressed in the Class D amplifier design is the non-ideal response of the output load. Specifically, some accommodation must be made for the frequency response of reactive loads. Moreover, the amplifier should be capable of driving a range of different output devices coupled to the system output.

SUMMARY OF INVENTION

According to the principles of the present invention, an amplifier system is disclosed which includes a switching amplifier unit and analog conversion circuitry configured to recover an analog signal from an output signal of the switching amplifier. An adaptive filter coupled to an output of the conversion circuitry is configured to derive an inverse transfer function of a forward path through the amplifier system, which includes the analog conversion circuitry, the derived inverse transfer function is used to generate a coefficient map from which a compensation filter responsively compensates for variations in the output load of the amplifier unit.

The inventive concepts address a significant problem in the application of switched mode amplifiers generally, and particularly in applications in which faithful reproduction of the input signals is desired, namely the sensitivity of the frequency response of the system to the non-ideal conditions represented by realistic loads. Among other things, these concepts allow for the implementation of compensation mechanisms which equalize the frequency response of the amplifier system in the presence of reactive loads, as well as loads with nominal impedances that span the range of values presented by different output devices that may be connected to the amplifier system.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings in which like numbers represent like parts.

As previously described, in a Class D amplifier, efficiency is gained by switching the power devices hard between the power supply rails. The high frequency noise is then filtered with a low pass filter. Typically, the low pass filter is of the passive type, including inductive and/or capacitive reactive elements to smooth the signal.

Figure 1A:
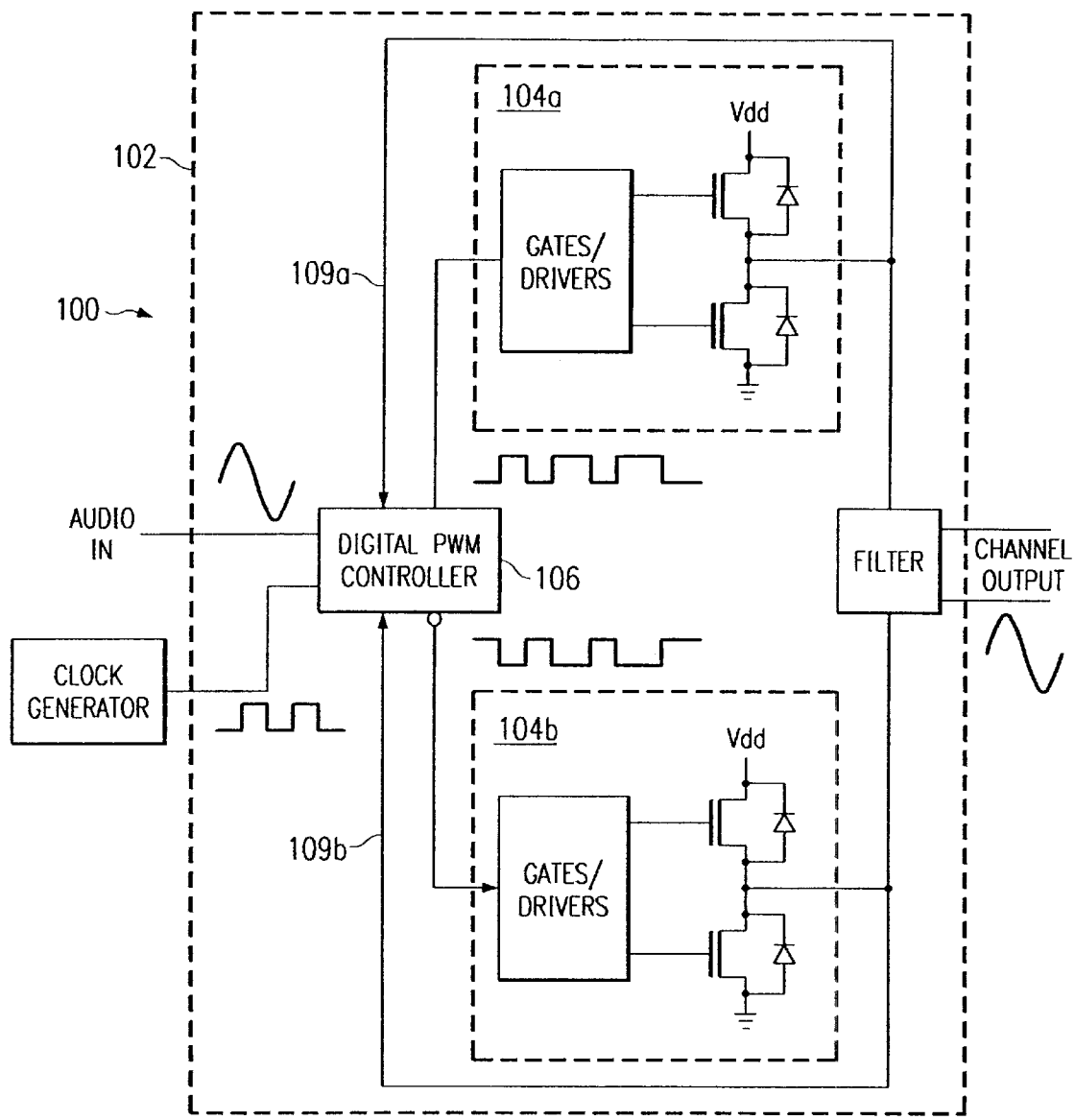
FIGS. 1A and 1B illustrates, in block diagram form, a switching amplifier system in accordance with the prior art.

FIG. 1A illustrates, in block diagram form, a typical Class D amplifier system 100. Amplifier system 100 includes Class D amplifier 102 containing MOSFET switches 104, along with their associated gates and drivers, and PWM controller 106. PWM controller 106 receives a digitized audio input signal (Audio In), which constitutes the signal to be amplified. MOSFET switches 104 may constitute a full bridge amplifier. Alternatively other circuit designs may be used, including a half-bridge switch. PWM controller also receives two feedback signals. Feedback path 109 from the output of MOSFET switches 104 may be used to correct the errors introduced by non-ideal switch behavior. PWM signal generation techniques are discussed in coassigned U.S. Pat. No. 5,815,102 to Melanson, entitled "Delta Sigma PWM DAC to Reduce Switching", and feedback from Class D amplifier switches is discussed in the coassigned U.S. Pat. No. 6,150,969 to Melanson entitled "Correction of Non-linear Output Distortion in a Delta Sigma DAC", which references are hereby incorporated herein by reference.

The amplified audio is recovered via low pass filter (LPF) 110, which provides the audio output to a load, Z. (LPF 110 is thus preferably a simple digital to analog converter.)

Figure 1B:
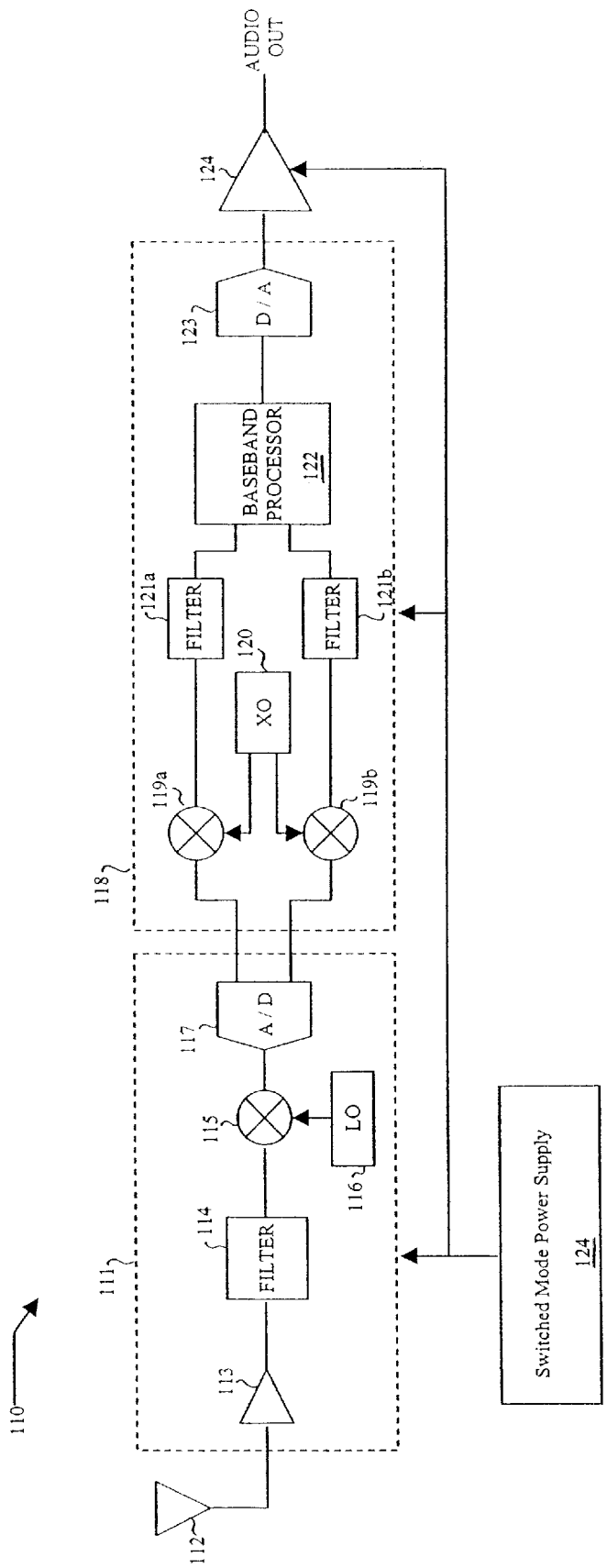

One possible application of audio amplifier 100 is in a digital radio 110, such as that shown in FIG. 1B.

Digital radio 110 includes an analog section or front-end 111-which receives radio frequency (RF) signals from an associated antenna 112. Analog front-end 111 is preferably a conventional RF down-converter including a low noise amplifier (LNA) 113 for setting the system noise figure, a bandpass filter 114 and mixer 115 driven by an analog local oscillator 116. The mixed-down analog signal is then converted into digital form by analog to digital converter 117.

The digitized data output from A D converter 117 is passed to digital processing section 118. A pair of mixers 119a,b generate in-phase (I) and quadrature (Q) signals from a corresponding pair of clock phases from crystal oscillator 120. The I and Q signals are next passed through bandpass filters 121*a* and 121*b* on to digital baseband processor 122. The processed digital signal is then re-converted to analog (audio) form by D/A converter 123.

A switched mode (Class D) audio power amplifier (APA) 124 is used to drive an external set of speakers or a headset. Preferably, at least some of the components of digital radio 110 are powered by a switched mode power supply (SMPS) 124.

To effectively attenuate out-of-band noise, the corner frequency of LPF 110 should be just above the passband of the amplifier system. However, this increases the error in the frequency response in the passband. Moreover, the frequency response is significantly affected by the load impedance, Z.

Figure 2:
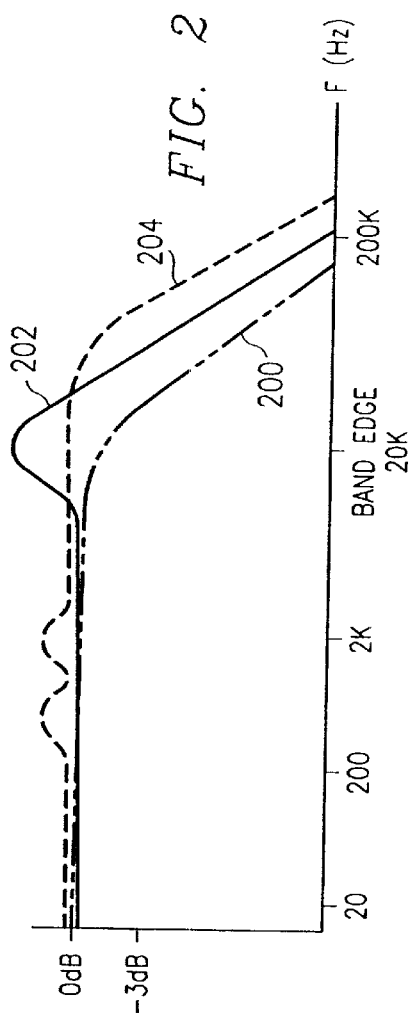
FIG. 2 illustrates, in graphical form, the frequency response of a switching amplifier system in accordance with FIG. 1.

FIG. 2 illustrates typical frequency response curves. Curves 200 and 202 are typical frequency responses with eight and sixteen ohm resistive loads, respectively. With a significant inductive component, which may be typical of audio amplification into speakers, a response of the form in curve 204 may result. Curve 204 exhibits a significant passband ripple. (The frequencies and gain levels shown in FIG. 2 are approximate and are provided as general reference to the depicted curves.)

A feedback path 112 from the output of LPF may be provided to compensate for frequency response modifications introduced by LPF 110. However, it may be difficult to make feedback path 112 effective and concomitantly guarantee the stability of the feedback loop. Typically, the load, Z, has a significant reactive component. Consequently, the phase shift of the filter is not well known, which exacerbates the question of the stability of the feedback loop. Moreover, with a digital PWM controller 106, feedback path 112 must include, an analog to digital (A/D) converter (not shown in FIG. 1.) This adds additional phase delay, further complicating the performance/stability trade off.

Figure 3:
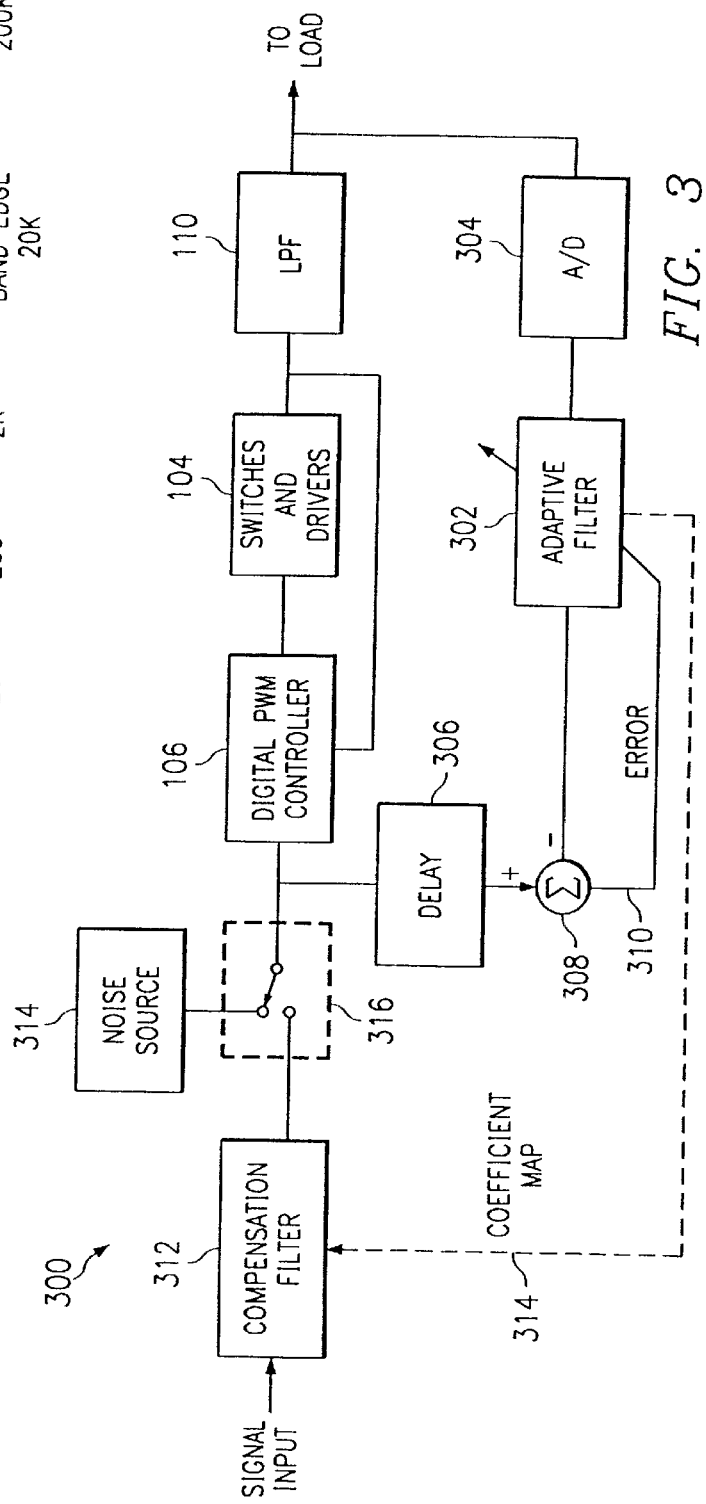
FIG. 3 illustrates a switching amplifier system in accordance with an embodiment of the present invention.

Refer now to FIG. 3 illustrating a switch mode amplifier system 300 in accordance with the principles of the present invention. Amplifier system 300 includes switching amplifier 102 and LPF 110 coupled to the load (not shown in FIG. 3). Amplifier system 300 includes adaptive filter 302, which may be a digital filter. The input to adaptive filter 302 is provided by the output of LPF 110 via analog-to-digital converter (A/D) 304. A/D 304 outputs a digital representation of the analog audio signal from LPF 110.

Adaptive filter 302 may be a finite impulse response (FIR) filter that "learns" the inverse of the transfer function of the forward path through amplifier system formed by switching amplifier 102, LPF 110 and the load (not shown in FIG. 3). Adaptive filter 302 derives the inverse transfer function by adjusting the FIR coefficients, as discussed below. Because the transfer function of LPF 110 is substantially all pole in nature, a FIR implementation of adaptive filter 302 is a good inverse, the FIR being an all zero filter. Filter 302 is adapted such that the combined forward path, including switching amplifier 102, LPF 110, the load, and adaptive filter 302 is equivalent to a pure delay. The signal input to switching amplifier 102 is equivalently delayed in delay 306. The frequency response of delay element 306 is flat. The output of delay element 306 is differenced with the output of adaptive filter 302 in adder 308. The output of adder 308 provides error signal 310 to adaptive filter 302.

Adaptive filter 302 adjusts the coefficients of the FIR in response to error signal 310. The adaptive filter adjusts the coefficients so as to drive the error signal towards zero. One such algorithm for adjusting the coefficients, known in the signal processing art, is the least-mean-square (LMS) algorithm; however, it should be recognized that other adaptation algorithms may also be used in alternative embodiments. For typical output filters 110, and loads that are primarily resistive, the order of compensating filter 312 may be in the range of from four (4) to ten (10). This range is exemplary, and longer filters may be implemented, in alternative embodiments of the present invention, to accommodate loads that have substantial reactive components, or to accommodate embodiments having more complex output filters, that is, filters having increased numbers of poles. Generally, the order of compensation filter depends on the desired flatness of the filter response; the longer the filter the more compensation that is possible. MATLAB simulations have shown that an audio load of 4–16 ohms plus a reactive component can be suitably compensated for with a $6^{th}$ order filter.

The signal to be amplified is input to compensation filter 312. The coefficients from adaptive filter 302 are mapped to the coefficients of compensation filter 312, indicated by the dashed path coefficient, coefficient map 314, in FIG. 3. Thus, the present invention provides a closed loop feedback compensation in which the loop is closed by the coefficient map 314. Compensation filter 312, thus, also has a transfer function that is the inverse of the forward path through switching amplifier system 300. Consequently, the output signal of the loaded amplifier system is flat over the bandwidth of the loop. Compensation filter 312 may be, in an embodiment of the present invention a FIR. In such an embodiment, compensation filter 312 coefficient map 314 may be a one-one copying of the coefficients of adaptive filter 302 to filter 312. However, filter 312 may also be implemented as in infinite impulse response (IIR) digital filter, and in yet another alternative embodiment implemented in the analog domain, as, for example, a switched capacitor filter.

System 300 also includes noise source 314 and switch 316. The input to switching amplifier 102 may be switched between noise source 314 and the output of compensation filter 312, as discussed further below. In normal operation, the switch selects the output from compensation filter 312.

Figure 4:
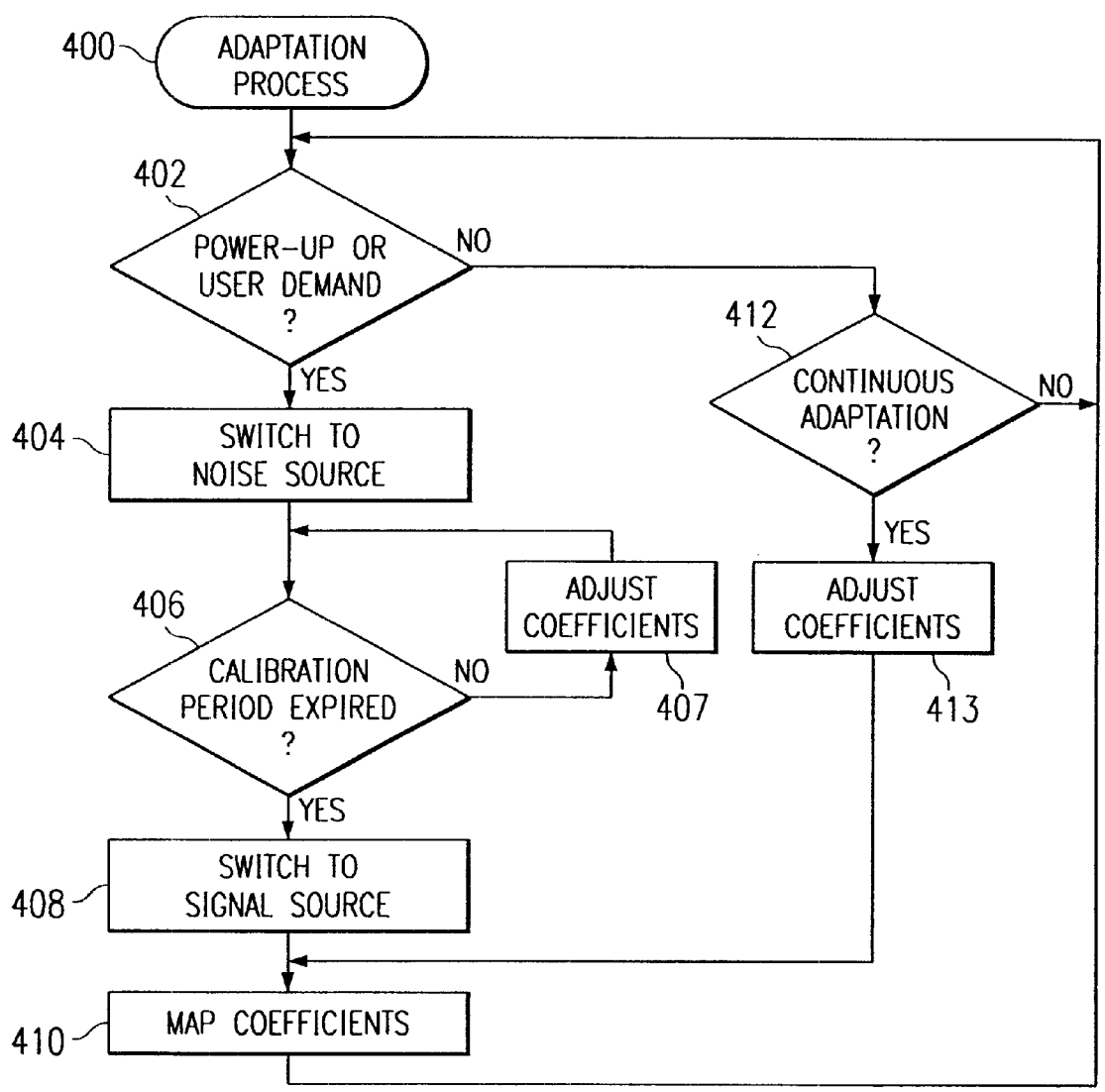
FIG. 4 illustrates an adaptation methodology in accordance with another embodiment of the present invention.

FIG. 4 is a flow chart of an adaptation (or calibration) methodology 400 in accordance with an embodiment of the present invention. In Step 402, a determination is made if the system is initializing on power-up, or if user initiated adaptation has been requested. The user may, for example, elect to train the compensation filter when the system is installed, or, if the load is changed.

If, in Step 402, a system power up has occurred, or user elected calibration is to be performed, in Step 404 process 400 switches to the noise source. Thus, in an embodiment of an amplifier system in accordance with FIG. 3, switch 316 couples the input of switching amplifier 102 to noise source 314. In Step 407, the coefficients of the adaptive filter, such as filter 402, FIG. 3, are adjusted, as long as the calibration cycle has not expired. After the calibration cycle, Step 406, the input to the switching amplifier, such as switching amplifier 102, is switched to the signal source, Step 408. The signal source, in accordance with system 300, is the output of compensation filter 312. Additionally, in Step 410, the coefficients of the adaptive filter are mapped into the compensation filter. Process 400 then returns to step 402.

Adaption process 400 may also continuously adapt the switch mode amplifier system. If, in Step 402, neither a system power up event nor user demanded calibration event has occurred, then in Step 412, a determination is made as to continuous adaptation is enabled. If not, process 400 loops back to Step 402. Otherwise, process 400 proceeds to Step 413 and adjusts the coefficients of the adaptive filter, such as filter 302. In Step 410, the adaptive filter coefficients are mapped to the compensation filter. Process 400 then continuously loops between Steps 410, 402 and 412 to continuously adapt the switch mode amplifier system. The continuous adaptation may be interrupted by a user elected calibration at Step 402, as process 400 loops.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. An amplifier system comprising:
   switching amplifier circuitry for driving a load;
   analog conversion circuitry for recovering an analog signal from an output signal of said switching amplifier circuitry;
   an adaptive filter coupled to an output of said analog conversion circuitry, for deriving an inverse transfer function through said amplifier system and generating a coefficient map in response; and
   a compensation filter coupled to said switching amplifier circuitry and responsive to said coefficient map for compensating for variations in said load.

2. The system of claim 1 further comprising:
   control circuitry for receiving an input signal to be amplified; and
   a switching unit configured to output an amplified signal in response to a drive signal from said control circuitry.

3. The system of claim 2 wherein said control circuitry comprises a pulse width modulator (PWM).

4. The system of claim 1 wherein said forward path comprises said amplifier unit, said analog conversion circuitry and a load for receiving said analog signal coupled to said analog conversion circuitry.

5. The system of claim 1 wherein said analog conversion circuitry comprises a low pass filter (LPF).

6. The system of claim 1 further comprising a compensation filter coupled to an input of said amplifier unit, said compensation filter configured to generate said an inverse transfer function in response to data from said adaptive filter.

7. The system of claim 6 wherein said adaptive filter comprises a first finite impulse response digital filter (FIR) and said data comprises coefficient values of said first FIR.

8. The system of claim 7 further comprising an analog to digital converter (ADC) coupled between an output of said analog conversion circuitry and said adaptive filter.

9. The system of claim 1 further comprising a noise source, said noise source operable for providing an input signal to said switching amplifier circuitry, in response to an adaptation cycle for training said adaptive filter.

10. The system of claim 1 further comprising adder circuitry configured to receive a signal input to said amplifier unit and an output signal from said adaptive filter, said adaptive filter deriving said inverse transfer function in response to an error signal from said adder circuitry, said error signal comprising a difference of said signal input to said amplifier unit and said output signal from said adaptive filter.

11. The system of claim 7 wherein said compensation filter comprises a second finite impulse response digital filter (FIR), and wherein said second FIR is configured in response to copying said coefficient values of said first FIR to said second FIR.

12. The amplifier systems of claim 1, wherein the switching amplifier drives the load through an output filter of a selected frequency response.

13. A method of compensating for load variations in a switching amplifier system comprising the steps of:
   deriving an inverse transfer function through the amplifier system using an adaptive filter;
   generating a coefficient map corresponding to the inverse transfer function; and
   applying the coefficient map to a compensation filter in the forward path of the amplifier system to compensate for variations in the load.

14. The method of claim 13 wherein said step of deriving said inverse transfer function comprises a step of calibrating the adaptive filter.

15. The method of claim 14 wherein said step of calibrating the adaptive filter comprises continuously calibrating the adaptive filter, calibrating said adaptive filter in response to user demand, or calibrating said adaptive filter on startup of said amplifier system.

16. The method of claim 14 wherein said step of calibration of the adaptive filter comprises adjusting one or more coefficients of a finite impulse response digital filter (FIR).

17. The method of claim 14 further comprising the step of mapping configuration data of the adaptive filter to a compensation filter, the compensation filter receiving an input signal for the amplifier system and outputting a signal for amplification on the forward path through the amplifier system.

18. The method of claim 15 wherein, if said, step of calibrating the adaptive filter is in response to user demand or on startup of the amplifier system, said step of performing the adaption of the adaptive filter further comprises the step of coupling a noise source to an input of an amplifier unit, the amplifier unit providing the output signal from the amplifier system.

19. The method of claim 13, further comprising driving a load with an output filter having a selected frequency response.

20. An amplifier comprising:
   switched- mode amplifier circuitry for amplifying an input signal;
   circuitry for recovering an audio signal from an output signal from said amplifier means; and
   circuitry for deriving an inverse transfer function of a forward path through said amplifier.

21. The amplifier of claim 20 wherein said forward path includes a load coupled to said amplifier.

22. The amplifier of claim 20 further comprising circuitry for generating said inverse transfer function in response to data from said circuitry for deriving said inverse transfer function, said circuitry for generating said inverse transfer function configured for receiving said input signal, and outputting a signal to said amplifying circuitry.

23. The amplifier of claim 20 further comprising circuitry for generating a difference of said input signal and an output signal from said circuitry for deriving said inverse transfer function, said circuitry for deriving being configured in response to said difference of said input signal and said output signal.

24. The amplifier of claim 20 wherein said circuitry for recovering said audio signal comprises a low pass filter (LPF).

25. The amplifier of claim 22 wherein said circuitry for deriving said inverse transfer function comprises a finite impulse response digital filter (FIR), said data from said circuitry for deriving means comprising coefficient values of said FIR.

26. The amplifier of claim 20, further comprising output filtering circuitry of a selected frequency response for driving an output load.

* * * * *